United States Patent [19]
Saito et al.

[11] Patent Number: 6,131,725
[45] Date of Patent: Oct. 17, 2000

[54] BELT FOR CONVEYING CHIP COMPONENTS, AND METHOD OF MANUFACTURING THE SAME

[75] Inventors: Koji Saito; Taro Yasuda, both of Tokyo, Japan

[73] Assignee: Taiyo Yuden Co., Ltd., Tokyo, Japan

[21] Appl. No.: 09/047,507

[22] Filed: Mar. 25, 1998

[30] Foreign Application Priority Data

Mar. 25, 1997 [JP] Japan ................................. 9-071456

[51] Int. Cl.[7] .......................... B65G 13/02; B65G 15/42; B65G 17/46; B65G 25/00; B65G 29/00
[52] U.S. Cl. .................. 198/690.2; 198/846; 198/844.1
[58] Field of Search ................. 198/690.2, 846, 198/847, 844, 494, 497

[56] References Cited

U.S. PATENT DOCUMENTS

| | | | |
|---|---|---|---|
| 4,270,656 | 6/1981 | Chesmer et al. | 198/847 |
| 4,578,906 | 4/1986 | Appleton | 51/170 EB |
| 5,147,028 | 9/1992 | Raggi | 198/497 X |
| 5,797,063 | 8/1998 | Umezawa et al. | 198/494 X |
| 5,911,307 | 6/1999 | Kraft et al. | 198/847 |
| 5,924,917 | 7/1999 | Benedict et al. | 451/526 X |
| 5,934,505 | 8/1999 | Shimada | 221/236 X |

*Primary Examiner*—Christopher P. Ellis
*Assistant Examiner*—Gene O. Crawford
*Attorney, Agent, or Firm*—Lowe Hauptman Gopstein Gilman & Berner

[57] ABSTRACT

A chip component conveyor belt of the present invention comprises an endless timing belt having a plurality of teeth at predetermined intervals on its back surface. Wherein a height of the teeth is made uniform by polishing or grinding the tip of each tooth. Thus, there arises no variation of surface height of the endless timing belt even when any tooth of the endless timing belt meshes a timing pulley, or even when the endless timing belt is supported by a belt guide member.

4 Claims, 3 Drawing Sheets

BELT FOR CONVEYING CHIP COMPONENTS, AND METHOD OF MANUFACTURING THE SAME

BACKGROUND OF THE INVENTION

1. Field of the Invention

The present invention relates to an endless belt used for conveying chip components on a chip component feeding apparatus or the like and a method of manufacturing the same.

2. Description of the Prior Art

FIG. 5 shows an example of a chip component feeding apparatus using an endless belt. Referring to the figure, numeral 1 denotes a vertical passage, numeral 2 denotes a curved passage, numeral 3 denotes a transverse passage, numeral 4 denotes a stopper, numeral 5 denotes a component take-out port, numeral 6 denotes a pair of front and rear timing pulleys, numeral P denotes a chip component P, and numeral B denotes a timing belt.

The vertical passage 1 and the curved passage 2 have a passage shape matching the end-face shape of the chip component P, and allow the chip components P to move downward by self-weight in longitudinally aligned state. The passage shape of the vertical passage 1 and the curved passage 2 is rectangular in the transverse cross section when the chip component P has a flat prism shape, and square in the cross section when the chip component P has a square prism shape or a cylinder shape.

The transverse passage 3 has a passage shape similar to that of the vertical and curved passages 1 and 2, aligns and guides the chip components P which are conveyed forward by the timing belt B. The transverse passage 3 opens in its bottom surface, the opening being closed by the surface of the timing belt B. The transverse passage 3 is provided at its front end with the stopper 4 for stopping at a take-out position the chip components P transported forward by the timing belt B. In addition, the component take-out port 5 is provided behind the stopper 4, the port 5 having a sufficient size to take out the component.

The timing pulleys 6 are disposed at the front and rear portions of the transverse passage 3. The timing belt B is wound around the timing pulleys 6, and an upper flat section of the timing belt B movably contacts with the opening face in the transverse passage 3. One of the timing pulleys 6 is intermittently rotated by a predetermined angle in the counterclockwise direction in the figure by an intermittent drive mechanism (not shown) including a ratchet mechanism, whereby the upper flat section of the timing belt B is intermittently moved to the left in the figure by a predetermined distance.

The upper end of the vertical passage 1 leads to a component storage chamber (not shown) in which a large number of single kind of chip components P are stored in a bulk state. The chip components P in the component storage chamber go in the upper opening of the vertical passage 1 one by one in a longitudinally orientation, pass through the vertical passage 1 and the curved passage 2 by self-weight, and are discharged from the lower end of the curved passage 2 onto the surface of the timing belt B.

The chip components P discharged onto the surface of the timing belt B and conveyed forward by the intermittently advancing timing belt B. Since the intermittent advance of the timing belt B is repeated in a predetermined cycle, the chip components P in the curved passage 2 are successively discharged onto the surface of the timing belt B. The discharged chip component P is moved forward in a longitudinally aligned state together with the timing belt B while being aligned by the transverse passage 3.

When a forefront chip component P among the chip components P moving forward together with the timing belt B touches the stopper 4, the succeeding chip components P are also stopped in a manner following the forefront one, whereby the forefront one can be taken out from the component take-out port 5.

Thereafter, every time the forefront chip component P is taken out from the take-out port 5 by a suction nozzle (not shown), the timing belt B is intermittently moved forward by the predetermined distance, and then the following chip component P again touches the stopper 4, and can be taken out.

By the way, the above chip component feeding apparatus utilizes the upper flat section of the timing belt B wound around a pair of front and rear timing pulleys 6 for conveying the chip components P, and the chip components P are taken out on the upper flat section near the front timing pulley 6.

For such a kind of the timing belt B, JIS standards prescribe accuracy of tooth height at ±0.2 mm. When the chip component P to be conveyed has a large size, there is no particular difficulty even if the timing belt B with such dimensional accuracy is used. However, when the chip component P becomes to have a minute size, there arises the following difficulty.

More specifically, when the timing belt B used has ±0.2 mm height accuracy of a tooth Ba, there intermix, as shown in FIG. 6 (a), tooth Ba with a reference height t, higher tooth Ba with height t1 which is larger than the reference height t by up to 0.2 mm, and lower tooth Ba with height t2 which is smaller than the reference height t by up to 0.2 mm.

That is, assuming that the surface height of the timing belt is Ht when the tooth Ba with the reference height t meshes the timing pulley 6, as shown in FIG. 6(b), the surface height of the timing belt B is Ht1 higher than Ht by 0.2 mm when the tooth Ba with height t1 (>t) meshes the timing pulley 6, and is Ht2 lower than Ht by 0.2 mm when the tooth Ba with height t2 (<t) meshes the timing pulley 6.

Therefore, when the minute chip component P, for example, the chip component P with thickness or diameter of 1 mm or less is conveyed by the timing belt B, the surface height of the timing belt B would be varied at the component take-out position by about one half of the thickness or diameter of the chip component P at the maximum. Then, similar height variations appear on the chip components P at the component take-out position, so that it may tend to failure in taking out the components by the suction nozzle.

Such difficulty also occurs when the component take-out position is shifted backward from the front timing pulley 6 and the upper flat section of the timing belt B is supported by a belt guide 7, as shown in FIG. 6(c). In particular, if there is only a small clearance between the timing belt B and the belt guide 7, the teeth may contact the belt guide 7, causing similar height variations on the chip components P during transport, whereby failure occurs in conveying.

SUMMARY OF THE INVENTION

A first object of the present invention is to provide a chip component conveyor belt which can satisfactorily perform taking-out and conveyance of minute chip components. To attain this object, a chip component conveyor belt according to the present invention comprises an endless timing belt, and a plurality of teeth provided at predetermined intervals on a back face of said timing belt, said teeth having uniform height by grinding the tip of each tooth. According to this chip component conveyor belt, since the height of each teeth of the timing belt is made uniform by grinding the tip of each teeth, there arises no variation in the surface height of the timing belt when any tooth meshes a timing pulley, and when the timing belt is supported by a guide member.

A second object of the present invention is to provide a method suitable of manufacturing the above chip component conveyor belt. To attain this object, a method for manufacturing a chip component conveyor belt according to the present invention comprising the steps of preparing an endless timing belt having a plurality of teeth at predetermined intervals on its back surface, and grinding the tips of said teeth of said timing belt so that a height of each tooth is made uniform. According to this method for manufacturing a chip component conveyor belt, it is possible to properly manufacture the above-mentioned timing belt for conveying chip components with high accuracy.

The above object, and other objects, features and advantages of the present invention will be clarified from the following description and the attached drawings.

BRIEF DESCRIPTION OF THE DRAWINGS

FIGS. 2 and 3 are an embodiment of a process for manufacturing a belt to which the present invention is applied, wherein FIG. 2 is a step for grinding the surface of the timing belt, FIG. 3 being a step for grinding the back surface (tips of teeth) of the timing belt;

DESCRIPTION OF THE PREFERRED EMBODIMENTS

Now, description is made on a method of manufacturing a chip component conveyor belt according to the present invention with reference to FIGS. 1(a)–(c), 2 and 3.

Figure 1:
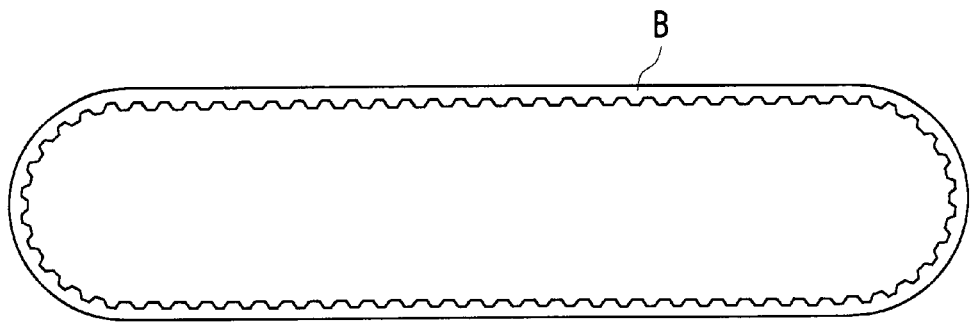
FIGS. 1(a)–(c) are an embodiment of a timing belt to which the present invention is applied, wherein FIG. (a) is a side view of a timing belt, FIG. (b) is a partial enlarged side view of the timing belt, FIG. (c) is a sectional view taken along line c—c in FIG. 1(b)
Figure 1:
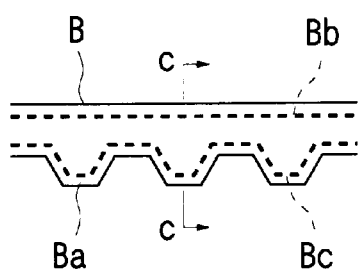
Figure 1:
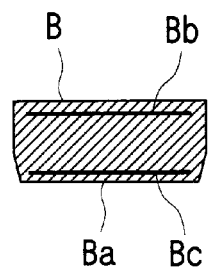

First, there is prepared an endless timing belt B as shown in FIG. 1(a), or an endless timing belt having a plurality of teeth Ba on its back surface at predetermined intervals. The timing belt B is a conventional one made of synthetic rubber such as neoprene. Of course, it may be allowed to purchase an endless timing belt B having teeth Ba with height accuracy of ±0.2 mm as described in the Prior Art section. The timing belt B contains therealong core yarns Bb in its surface side and canvas Bc along the teeth Ba in its back surface side as reinforcement, as shown in FIGS. 1(b) and (c).

Figure 2:
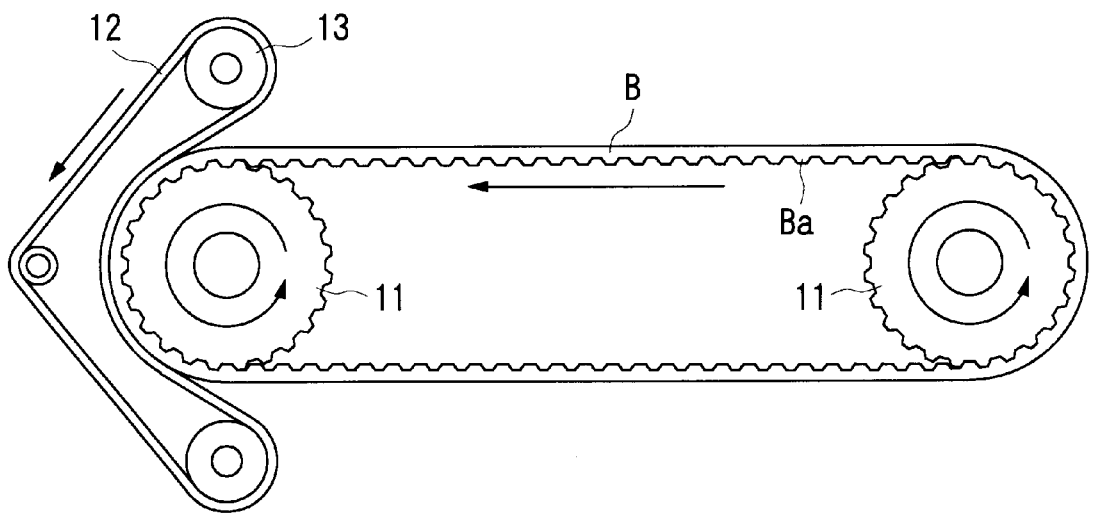

Then, as shown in FIG. 2, the timing belt B is wound around with a predetermined tension a pair of timing pulleys 11 which has a groove pitch matching the timing belt B, with the surface of the timing belt B facing outside. The surface of the timing belt B passing over either one of the pulleys 11 is relatively pressed against an abrasive belt 12 while rotating either one of the pulleys 11 in counterclockwise direction in the figure to rotate the timing belt B. This abrasive belt 12 comprises an endless element made of synthetic rubber, soft resin, fabric or the like fixed with abrasive material on its surface, or an endless element made of a material with predetermined surface roughness and hardness. It is rotated in a direction opposite to the timing belt B in a state where it is wound around three pulleys 13.

According to the above step, the surface of the timing belt B is ground by the abrasive belt 12, so that the surface of the timing belt B is smoothed as a whole. Incidentally, the roughness of the abrasive sheet 12 is suitably selected depending on the material of the timing belt B through prior experiments or the like.

Figure 3:
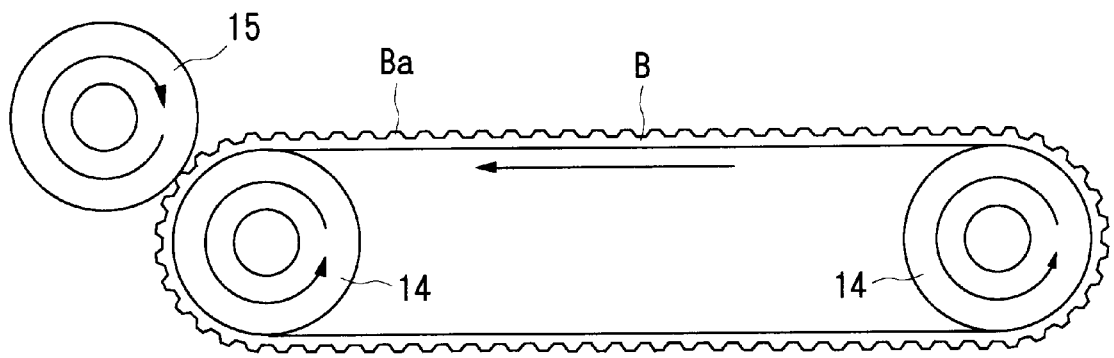

Then, the timing belt B after being ground is removed from the pair of pulleys 11, turned inside out, and wound around with a predetermined tension a pair of pulleys 14 with a flat outer surface, as shown in FIG. 3, so that the back surface of the timing belt B is faced outside. Then, while rotating either one of the pulleys 14 in counterclockwise direction in the figure to rotate the timing belt B, the tips of teeth Ba passing over the one of the pulleys 14 are relatively pressed against a grindstone 15. This grindstone 15 comprises a disk-shaped element made of ceramics, hard resin, metal or the like fixed with abrasive material on its surface, or a disk-shaped element made of a material with predetermined surface roughness and hardness. It is rotated in an opposite direction to the timing belt B.

According to the above step, the tip of each tooth Ba is ground by the grindstone 15, so that the height of each tooth Ba is made uniform. Incidentally, the roughness of the grindstone 15 is suitably selected depending on the material of the timing belt B through prior experiments or the like as in the abrasive sheet 12. Thus, this produces a timing belt B suitable for conveying chip components.

Figure 4:
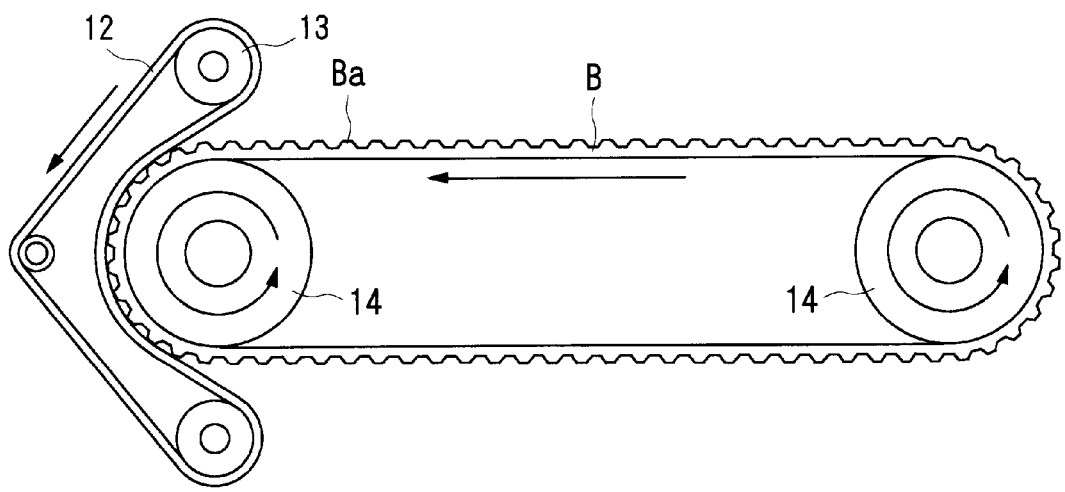
FIG. 4 is a modification of the step for grinding the surface of the timing belt.

While FIG. 3 shows an arrangement in which the tip of each tooth Ba on the timing belt B is ground by the grindstone 15, the tip of each tooth Ba may be ground by utilizing the abrasive belt 12 similar to the one as shown in FIG. 2, as shown in FIG. 4. In addition, the surface of the timing belt B may be ground by the grindstone 15 similar to the one as shown in FIG. 3. Of course, other grinding tools than the above mentioned means may be utilized for each grinding.

Thus, according to the manufacturing method of a belt described above, it is easy to obtain a timing belt B on which the height of each tooth Ba is made uniform, and, more particularly, a timing belt B in which the each tooth Ba has a height accuracy of ±0.02 mm which is higher accuracy than the JIS standards (±0.2 mm) by grinding the tip of each tooth Ba provided on the back surface of the timing belt B.

In addition, since the tip of each tooth Ba is ground while the timing belt B is being rotated with the pulleys 14 in a state where the timing belt B turned inside out is wound around the pulleys 14, productivity can be improved by efficiently grinding each tooth Ba.

Figure 5:
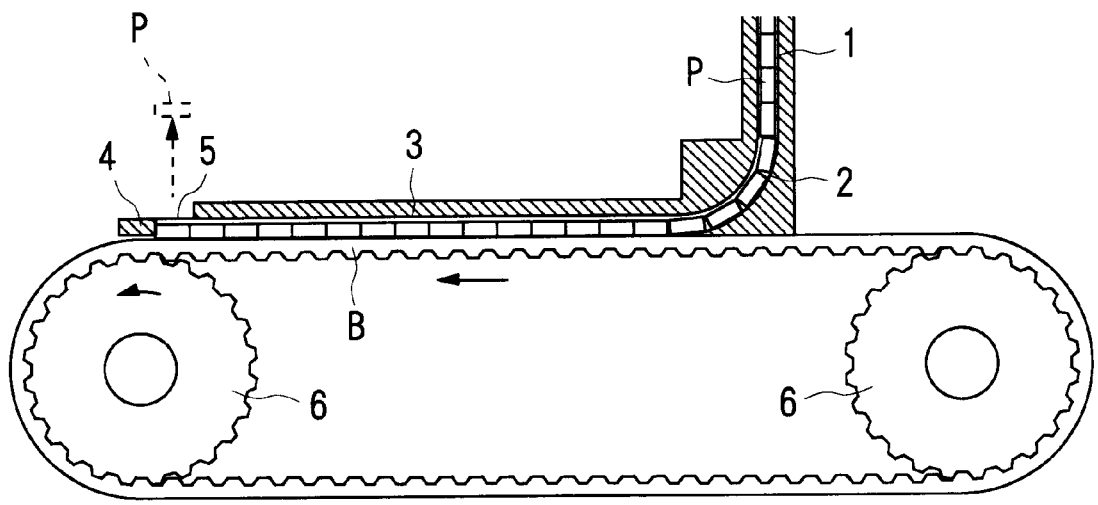
FIG. 5 is a schematic representation of a chip component feeding apparatus using an endless timing belt.
Figure 6:
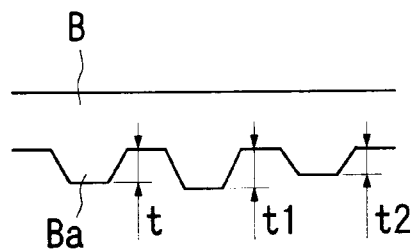
FIGS. 6(a)–(c) are views for illustrating difficulties of a conventional timing belt.
Figure 6:
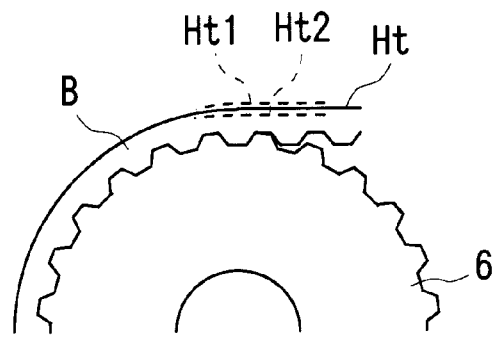
Figure 6:
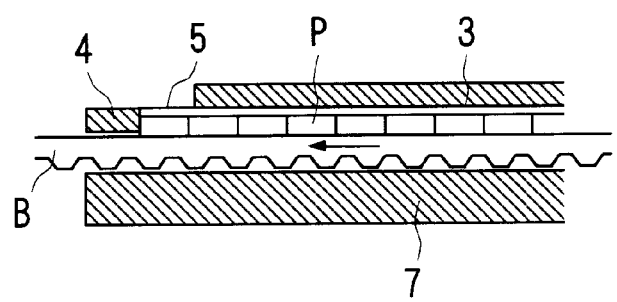

When the timing belt B thus manufactured is used for the chip component feeding apparatus as shown in FIG. 5, variation of surface height of the timing belt B can be surely prevented even when any tooth Ba of the timing belt B meshes the timing pulleys 6, or even when the timing belt B is supported by the belt guide 7 shown in FIG. 6(c).

In other words, even when minute components, for example, chip components P with height and diameter of 1 mm or less are conveyed by the timing belt B, the chip components are successfully taken out and conveyed while generation of variation in the height of chip components is surely prevented at the component take-out position or during transport.

As described above in detail, according to the chip component conveyor belt of the present invention, the chip components can be successfully taken out or conveyed while generation of variation in the height of chip components is surely prevented at the component take-out position or during transport. In addition, according to the method of manufacturing a chip component conveyor belt, it is possible to easily and properly obtain the timing belt in which height of each tooth on its back surface is made uniform.

What is claimed is:

1. A method of manufacturing a chip component conveyor belt which conveys chip components on its surface with its own movement comprising the steps of:

preparing an endless timing belt having a plurality of teeth at predetermined intervals on its back surface; and grinding the tips of said teeth of said timing belt so that a height of each tooth is made uniform by winding said timing belt in a state turned inside out around at least two pulleys, and grinding the tips of said teeth with a grinding tool while said timing belt is in the inside out state and being rotated by the pulleys.

2. The method of manufacturing a chip component conveyor belt as set forth in claim 1, further comprising a step of smoothing said surface of said timing belt by grinding said surface.

3. The method of manufacturing a chip component conveyor belt as set forth in claim 1, wherein said grinding tool comprises an endless abrasive belt wound around at least two pulleys, and being rotated in a direction opposite to said timing belt.

4. The method of manufacturing a chip component conveyor belt as set forth in claim 1, wherein said grinding tool comprises a disk-shaped grindstone being rotated in a direction opposite to said endless timing belt.

\* \* \* \* \*